(12) United States Patent
Quesnel et al.

(10) Patent No.: US 11,362,296 B2
(45) Date of Patent: Jun. 14, 2022

(54) ELECTROLUMINESCENT DEVICE

(71) Applicant: Commissariat a l'Energie Atomique et aux Energies Alternatives, Paris (FR)

(72) Inventors: Etienne Quesnel, Grenoble (FR); Marianne Consonni, Grenoble (FR); Sylvia Meunier, Grenoble (FR); Benoit Racine, Grenoble (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 127 days.

(21) Appl. No.: 16/993,506

(22) Filed: Aug. 14, 2020

(65) Prior Publication Data

US 2021/0050544 A1 Feb. 18, 2021

(30) Foreign Application Priority Data

Aug. 16, 2019 (FR) ...................................... 19 09241

(51) Int. Cl.
*H01L 51/50* (2006.01)
*H01L 51/52* (2006.01)

(52) U.S. Cl.
CPC ...... *H01L 51/5012* (2013.01); *H01L 51/5271* (2013.01); *H01L 51/5293* (2013.01)

(58) Field of Classification Search
CPC ............. H01L 51/5012; H01L 51/5271; H01L 51/5293
See application file for complete search history.

(56) References Cited

U.S. PATENT DOCUMENTS

| | | | |
|---|---|---|---|
| 2010/0096617 | A1 | 4/2010 | Shanks |
| 2011/0180823 | A1 | 7/2011 | Usami |
| 2012/0200221 | A1 | 8/2012 | Inoue |
| 2014/0042409 | A1 | 2/2014 | Ohyama |

FOREIGN PATENT DOCUMENTS

| | | |
|---|---|---|
| EP | 3 503 224 A1 | 6/2019 |
| JP | 2000-195673 A | 7/2000 |
| WO | WO 2010/032651 A1 | 3/2010 |
| WO | WO 2010/045606 A1 | 4/2010 |

OTHER PUBLICATIONS

French Preliminary Search Report dated May 25, 2020 in French Application 19 09241 filed on Aug. 16, 2019 (with English Translation of Categories of Cited Documents & Written Opinion), 13 pages.

*Primary Examiner* — Anthony Ho
(74) *Attorney, Agent, or Firm* — Oblon, McClelland, Maier & Neustadt, L.L.P.

(57) ABSTRACT

A device includes first and second electrodes that are at least partially transparent in a spectral domain; an electroluminescent layer that lies between the first and second electrodes suitable for emitting electromagnetic radiation in the spectral domain, the electromagnetic radiation being circularly polarized in a first polarization direction; a structured substrate, the first electrode lying between the structured substrate and the electroluminescent layer, the structured substrate including features that are reflective in the spectral domain, and that possess a hollow geometric shape configured so that electromagnetic radiation that passes through the first electrode is reflected from the reflective features while preserving the first polarization direction, a filler material that is transparent in the spectral domain and that is arranged to fill the reflective features so that the structured substrate has a planar surface.

15 Claims, 5 Drawing Sheets

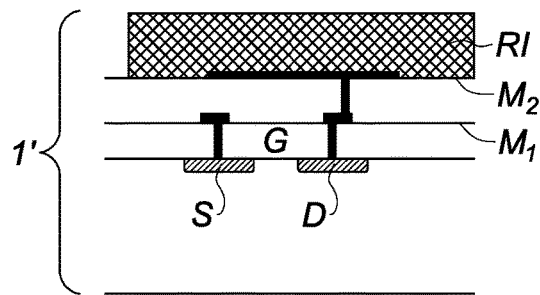
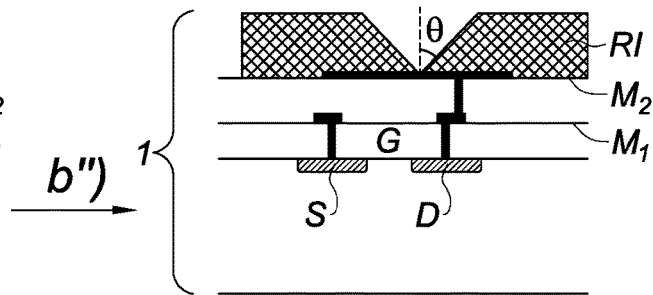
Fig. 6a                Fig. 6b
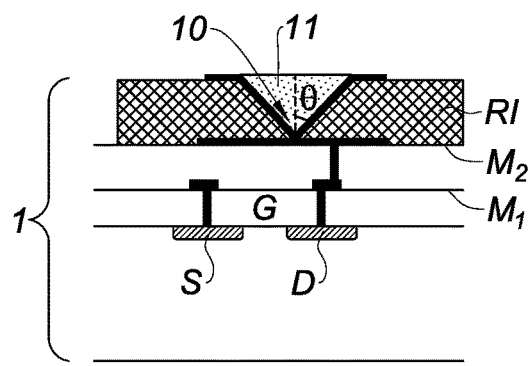
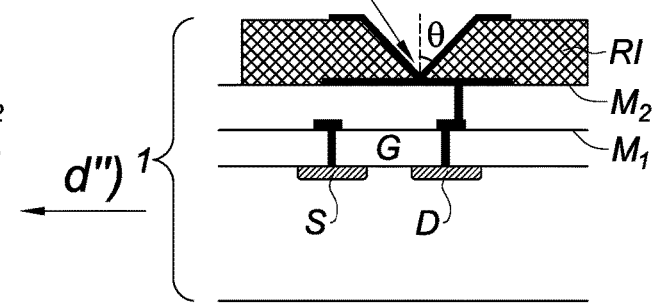
Fig. 6d                Fig. 6c
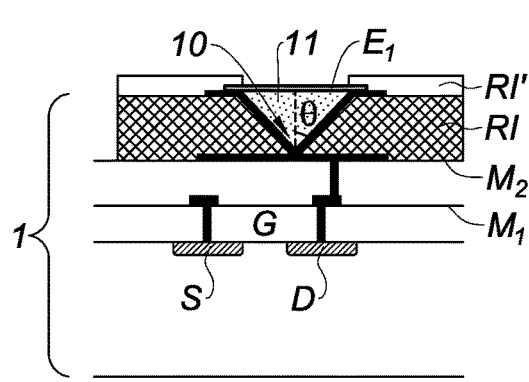
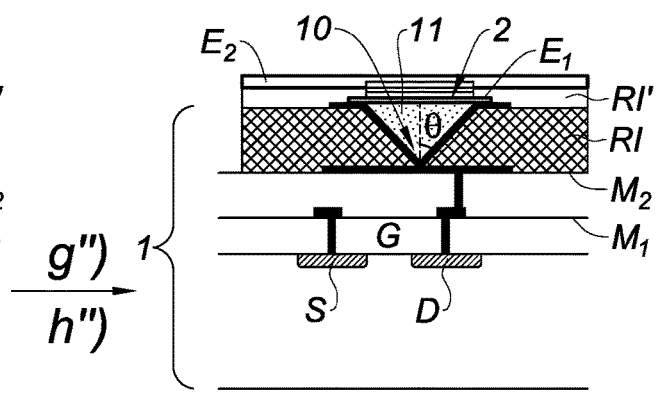
Fig. 6e                Fig. 6f

ELECTROLUMINESCENT DEVICE

TECHNICAL FIELD

The invention relates to the technical field of electroluminescent devices, notably organic electroluminescent devices. More precisely, the invention aims to obtain an electroluminescent device that emits electromagnetic radiation that is circularly polarized with a high degree of polarization.

The invention is notably applicable to imaging in biology and more generally in the health field, or even to 2D and 3D displays.

PRIOR ART

One organic electroluminescent device known in the prior art and notably from the document Zinna et al., "*Highly Circularly Polarized Electroluminescence from a Chiral Europium Complex*", Advanced Materials, vol. 27, n° 10, 2015, (D1 below) comprises:
- a reflective first electrode made of aluminium;
- a transparent second electrode made of indium-tin oxide (ITO);
- an organic electroluminescent layer formed between the first and second electrodes and suitable for emitting electromagnetic radiation that is circularly polarized in a first polarization direction.

Such a prior-art device does not allow electromagnetic radiation that is circularly polarized with a high degree of polarization to be emitted out from the second electrode.

Specifically, the portion of the electromagnetic radiation emitted by the organic electroluminescent layer that is reflected from the first electrode possesses a second polarization direction, opposite to the first polarization direction. Now, the degree of polarization, denoted g, respects the following relationship:

$$g = 2\frac{I_L - I_R}{I_L + I_R}$$

where:
- $I_R$ is the intensity of the electromagnetic radiation circularly polarized in the first polarization direction, on exiting the second electrode, and
- $I_L$ is the intensity of the electromagnetic radiation circularly polarized in the second polarization direction, on exiting the second electrode.

The reflection of the portion of the electromagnetic radiation emitted by the organic electroluminescent layer from the first electrode decreases the degree of polarization g because $I_L$ is of the same order of magnitude as $I_R$.

In addition, as illustrated in FIG. 1 for a top-emitting architecture, one organic electroluminescent device known in the prior art comprises:
- a reflective first electrode $E_1$;
- a semi-transparent second electrode $E_2$;
- an organic electroluminescent layer EL formed between the first and second electrodes $E_1$, $E_2$ and suitable for emitting electromagnetic radiation that is circularly polarized in a first polarization direction.

In the same way, such a prior-art device does not allow electromagnetic radiation that is circularly polarized with a high degree of polarization to be emitted out from the second electrode $E_2$. Specifically, the portion of the electromagnetic radiation emitted by the organic electroluminescent layer EL that is reflected from the first electrode $E_1$ possesses a second polarization direction, opposite to the first polarization direction. The reflection of the portion of the electromagnetic radiation emitted by the organic electroluminescent layer EL from the first electrode $E_1$ decreases the degree of polarization g because $I_L$ is of the same order of magnitude as $I_R$.

SUMMARY OF THE INVENTION

The invention aims to remedy all or some of the aforementioned drawbacks. To this end, the subject of the invention is an electroluminescent device, comprising:
- first and second electrodes that are at least partially transparent in a spectral domain;
- an electroluminescent layer that lies between the first and second electrodes and that is suitable for emitting electromagnetic radiation in the spectral domain, the electromagnetic radiation being circularly polarized in a first polarization direction;
- a structured substrate, the first electrode lying between the structured substrate and the electroluminescent layer, the structured substrate comprising:
  features that are reflective in the spectral domain, and that possess a hollow geometric shape configured so that electromagnetic radiation that passes through the first electrode is reflected from the reflective features while preserving the first polarization direction,
  a filler material that is transparent in the spectral domain and that is arranged to fill the reflective features so that the structured substrate has a planar surface.

Thus, such a device according to the invention allows electromagnetic radiation that is circularly polarized in the first polarization direction to be emitted with a high degree of polarization from out of the second electrode. This is made possible by virtue of a suitable shape of the reflective features of the structured substrate, which allows the first polarization direction to be preserved.

In other words, $I_R \gg I_L$, where
- $I_R$ is the intensity of the electromagnetic radiation circularly polarized in the first polarization direction, on exiting the second electrode, and
- $I_L$ is the intensity of the electromagnetic radiation circularly polarized in the second polarization direction (which is opposite the first polarization direction), on exiting the second electrode.

On exiting the second electrode, $I_R$ is due:
- to the direct transmission of the electromagnetic radiation from the electroluminescent layer to the second electrode,
- to the reflections of the electromagnetic radiation from the reflective features of the structured substrate.

On exiting the second electrode, $I_L$ is due to the reflections of the electromagnetic radiation from the first electrode. The first electrode being semi-transparent or transparent (and therefore not very reflective), $I_L$ is therefore very low on exiting the second electrode with respect to $I_R$.

Moreover, the filler material allows the structured substrate to be planarized, so as to easily form:
- the first electrode on the structured substrate, for a top-emitting architecture, or
- the structured substrate on the first electrode, for a bottom-emitting architecture.

DEFINITIONS

By "at least partially transparent", what is meant is that the first electrode or the second electrode is:

semi-transparent, with an intensity transmission coefficient averaged over the spectral domain comprised between 30% and 70%, or transparent, with an intensity transmission coefficient averaged over the spectral domain higher than or equal to 70%, preferably higher than or equal to 80%, and more preferably higher than or equal to 90%.

The expression "lying between" does not imply that the electroluminescent layer makes contact with the first and second electrodes. The device may for example comprise (electron and hole) transport layers and (electron and hole) injection layers lying between an electrode and the electroluminescent layer (which is also called the emissive layer).

By "substrate", what is meant is a self-supporting physical carrier. For example, a substrate is conventionally a wafer cut from an ingot of crystalline semiconductor.

By "structured substrate", what is meant is that substrate has a non-planar surface (in the absence of filler material) defining a set of features (reliefs).

By "reflective", what is meant is that the features of the structured substrate possess an intensity reflection coefficient averaged over the spectral domain higher than or equal to 70%, preferably higher than or equal to 80%, and more preferably higher than or equal to 90%.

By "hollow geometric shape", what is meant is that each of the reflective features of the structured substrate bounds a cavity.

By "transparent", what is meant is that the filler material possesses an intensity transmission coefficient averaged over the spectral domain higher than or equal to 70%, preferably higher than or equal to 80%, and more preferably higher than or equal to 90%

The device according to the invention may comprise one or more of the following features.

According to one feature of the invention, the hollow geometric shape of the reflective features is configured so that electromagnetic radiation that passes through the first electrode is reflected from the reflective features N times, N being a non-zero even integer number.

In other words, the hollow geometric shape of the reflective features permits an even number of reflections between the electromagnetic radiation that passes through the first electrode and the reflective features. Thus, the electromagnetic radiation that passes through the first electrode preserves the first polarization direction at the end of the even number of reflections from the reflective features of the structured substrate. Specifically, for a given pair of reflections, the first reflection inverts the initial polarization direction then the second reflection again inverts the polarization direction, so as to return to the initial polarization direction.

According to one feature of the invention, the reflective features have at least one V-shaped profile.

By "profile", what is meant is a cross section of the reflective features, i.e. in a direction perpendicular to the normal to the planar surface of the structured substrate.

Thus, the electromagnetic radiation that passes through the first electrode preserves the first polarization direction at the end of two successive reflections from the reflective features of the structured substrate. More precisely, the first polarization direction is preserved at the end of two successive reflections from the flanks of each reflective feature of the structured substrate, the flanks having a V-shaped profile.

The reflective features may have first and second V-shaped profiles so that the structured substrate is bidirectional. The first profile extends in a first direction, perpendicular to the normal to the planar surface of the structured substrate. The second profile extends in a second direction, perpendicular to the first direction, and perpendicular to the normal to the planar surface of the structured substrate.

According to one feature of the invention, the reflective features comprise inclined flanks that make an angle comprised between 30° and 60°, and preferably comprised between 40° and 50°, with respect to the normal to the planar surface of the structured substrate.

One advantageous effect of the range [40°-50°] is to significantly increase the output optical coupling of the device with respect to extraction of electromagnetic radiation having undergone two reflections from the reflective features, the optimal angle being 45°.

According to one feature of the invention, the reflective features are of concave shape, and the structured substrate comprises a matrix array of microlenses forming the filler material.

One advantageous effect thereof is to significantly increase the output optical coupling of the device.

According to one feature of the invention, the reflective features are periodically distributed in a direction perpendicular to the normal to the planar surface of the structured substrate.

One advantageous effect thereof is to facilitate fabrication of the structured substrate on an industrial scale.

According to one feature of the invention, the electromagnetic radiation possesses a dominant wavelength, denoted $\lambda$, and the reflective features have a spatial period longer than $5\lambda$, and preferably longer than $10\lambda$.

By "dominant wavelength", what is meant is the wavelength of the spectral domain that corresponds to the frequency transporting the most energy, or that corresponds to the central frequency of the frequency range transporting the most energy.

One advantageous effect thereof is to prevent diffraction effects.

According to one feature of the invention, the electromagnetic radiation possesses a dominant wavelength, denoted $\lambda$, and the reflective features have a depth larger than $5\lambda$, and preferably larger than $10\lambda$.

By "depth", what is meant is the maximal dimension of the reflective features along the normal to the planar surface of the structured substrate.

One advantageous effect thereof is to prevent diffraction effects.

According to one feature of the invention, the depth, denoted H, and the spatial period, denoted P, respect H=P/2.

Thus, the reflective features have a V-shaped profile with inclined flanks that make an angle of 45°, each feature defining an isosceles right triangle, P being the hypotenuse and H being the height of the triangle.

According to one feature of the invention, the reflective features are made of a metal, which is preferably chosen from Ag and Al.

According to one feature of the invention, the electroluminescent layer is made of a chiral organic material.

According to one feature of the invention, the first and second electrodes are made of a transparent conductive oxide.

By "transparent conductive oxide", what is meant is an oxide possessing:

an intensity transmission coefficient averaged over the spectral domain higher than or equal to 70%, preferably higher than or equal to 80%, and more preferably higher than or equal to 90%, and an electrical conductivity at 300 K higher than or equal to $10^2$ S/cm.

According to one feature of the invention, the spectral domain is chosen from:
the visible domain with wavelengths comprised between 400 nm and 780 nm,
the UV-A domain with wavelengths comprised between 315 nm and 400 nm,
the near-infrared domain with wavelengths comprised between 780 nm and 3 μm.

BRIEF DESCRIPTION OF THE DRAWINGS

Other features and advantages will become apparent from the detailed description of various embodiments of the invention, the description containing examples and references to the appended drawings.

FIGS. 6a to 6f are schematic cross-sectional views illustrating a third process for fabricating an electroluminescent device according to the invention.

DETAILED DESCRIPTION OF EMBODIMENTS

Figure 1:
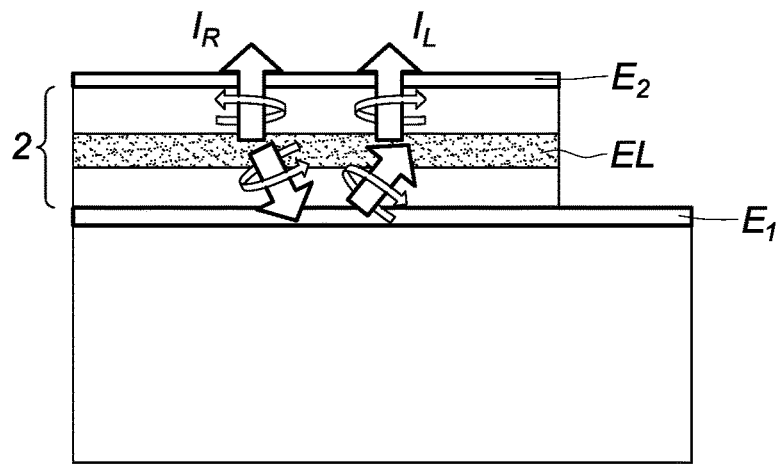
FIG. 1 is a schematic cross-sectional view of a prior-art electroluminescent device.
Figure 2:
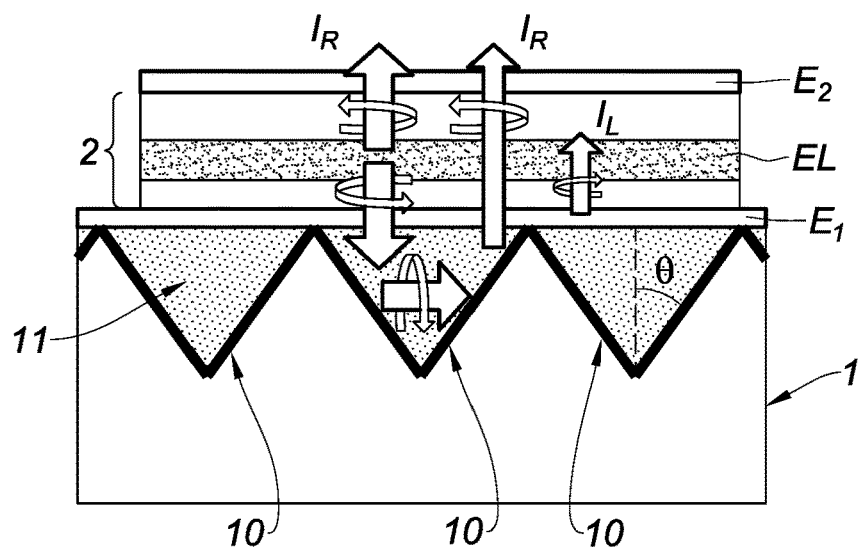
FIG. 2 is a schematic cross-sectional view of an electroluminescent device according to the invention.
Figure 3A:
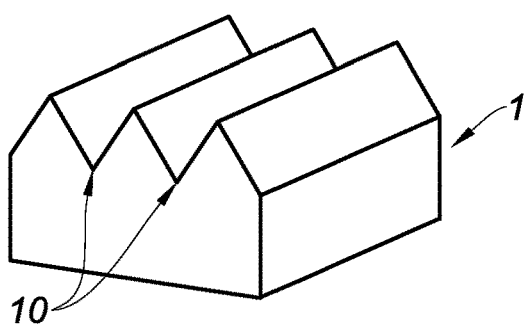
FIGS. 3a and 3b are schematic views, in perspective and in cross section, respectively, of a structured substrate (in the absence of a filler material) belonging to an electroluminescent device according to the invention.
Figure 3B:
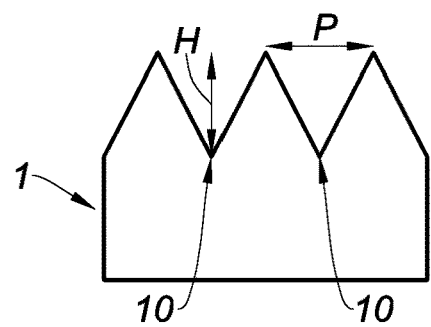
Figure 4A:
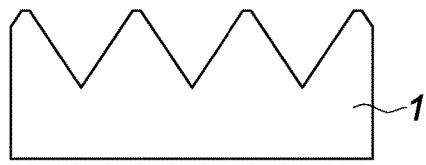
FIGS. 4a to 4h are schematic cross-sectional views illustrating a first process for fabricating an electroluminescent device according to the invention.
Figure 4B:
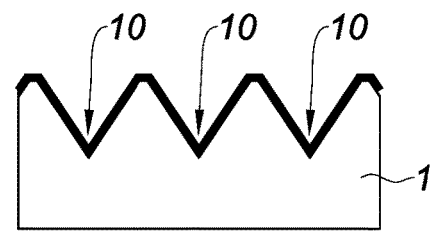
Figure 4C:
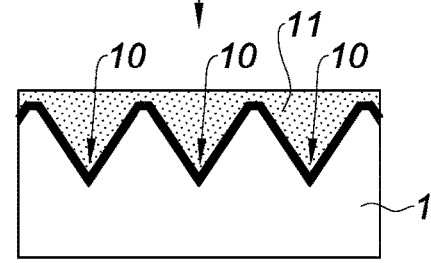
Figure 4D:
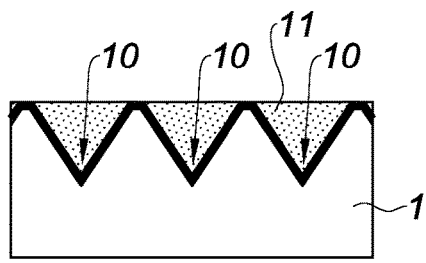
Figure 4E:
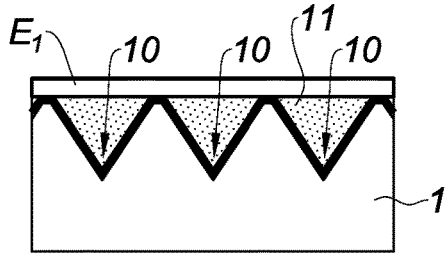
Figure 4F:
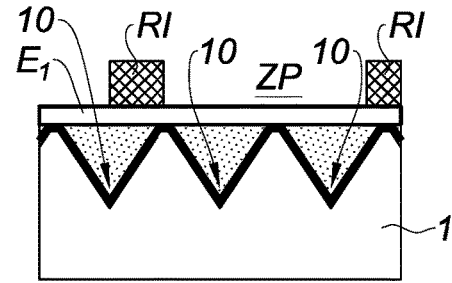
Figure 4H:
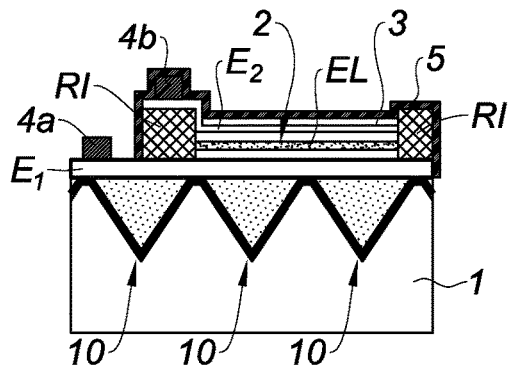
Figure 4G:
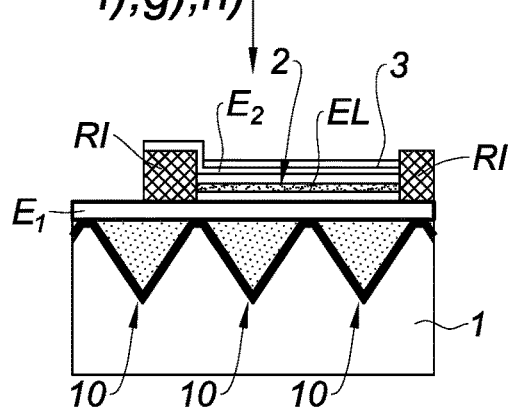

For the sake of simplicity, elements that are identical or that perform the same function in the various embodiments are designated with the same references.

One subject of the invention is an electroluminescent device, comprising:
first and second electrodes $E_1$, $E_2$ that are at least partially transparent in a spectral domain;
an electroluminescent layer EL that lies between the first and second electrodes $E_1$, $E_2$ and that is suitable for emitting electromagnetic radiation in the spectral domain, the electromagnetic radiation being circularly polarized in a first polarization direction;
a structured substrate 1, the first electrode $E_1$ lying between the structured substrate 1 and the electroluminescent layer EL, the structured substrate 1 comprising:
features 10 that are reflective in the spectral domain, and that possess a hollow geometric shape configured so that electromagnetic radiation that passes through the first electrode $E_1$ is reflected from the reflective features 10 while preserving the first polarization direction,
a filler material 11 that is transparent in the spectral domain and that is arranged to fill the reflective features 10 so that the structured substrate 1 has a planar surface.

First and Second Electrodes

For a bottom-emitting architecture, the second electrode $E_2$ is transparent, with an intensity transmission coefficient averaged over the spectral domain higher than or equal to 70%, preferably higher than or equal to 80%, and more preferably higher than or equal to 90%. The first electrode $E_1$ is preferably transparent, with an intensity transmission coefficient averaged over the spectral domain higher than or equal to 70%, preferably higher than or equal to 80%, and more preferably higher than or equal to 90%. The first and second electrodes $E_1$, $E_2$ may be made of a transparent conductive oxide. The second electrode $E_2$ may be made of indium-tin oxide (ITO).

For a top-emitting architecture, the second electrode $E_2$ is semi-transparent, with an intensity transmission coefficient averaged over the spectral domain comprised between 30% and 70%. The second electrode $E_2$ may be made of a metal such as Ag or Al. The first electrode $E_1$ is preferably transparent, with an intensity transmission coefficient averaged over the spectral domain higher than or equal to 70%, preferably higher than or equal to 80%, and more preferably higher than or equal to 90%. The first electrode $E_1$ may be made of a transparent conductive oxide.

Electroluminescent Layer

The electroluminescent layer EL is preferably organic. The organic electroluminescent layer EL is advantageously made of a chiral organic material. By way of non-limiting examples, the chiral organic material may be:
a helicene, such as a platinahelicene,
chiral poly(fluorene-alt-benzothiadiazole) (c-PFBT)—where "alt" designates an alternating copolymer,
a lanthanide complex,
an iridium (III) complex.

Other examples of organic materials suitable for emitting circularly polarized electromagnetic radiation are given in the document J. Han et al., "*Recent Progress on Circularly Polarized Luminescent Materials for Organic Optoelectronic Devices*", Advanced Optical Materials, vol. 6, 17, 2018.

According to one alternative, the electroluminescent layer EL may be inorganic, so as to obtain a spin-LED. By way of non-limiting examples, the inorganic electroluminescent layer EL may take the form of a quantum well, for example InGaN/GaN or AlGaAs/GaAs. Where appropriate, the second electrode $E_2$ is made of a magnetic material so as to circularly polarize the light emitted by the inorganic electroluminescent layer EL, the magnetic material possibly for example being MgO/FeCo. Where appropriate, the structured substrate 1 is preferably made of silicon.

The electromagnetic radiation emitted by the electroluminescent layer EL may possess a dominant wavelength, denoted λ. The spectral domain of the electromagnetic radiation emitted by the electroluminescent layer EL is advantageously chosen from:
the visible domain with wavelengths comprised between 400 nm and 780 nm,
the UV-A domain with wavelengths comprised between 315 nm and 400 nm, the near-infrared domain with wavelengths comprised between 780 nm and 3 µm.

The electroluminescent layer EL preferably does not make contact with the first and second electrodes $E_1$, $E_2$. The device may for example comprise (electron and hole) transport layers and (electron and hole) injection layers lying between an electrode $E_1$, $E_2$ and the electroluminescent layer EL (which is also called the emissive layer).

Structured Substrate

The hollow geometric shape of the reflective features 10 is advantageously configured so that electromagnetic radiation that passes through the first electrode $E_1$ is reflected from the reflective features N times, N being a non-zero even integer number.

Figure 7:
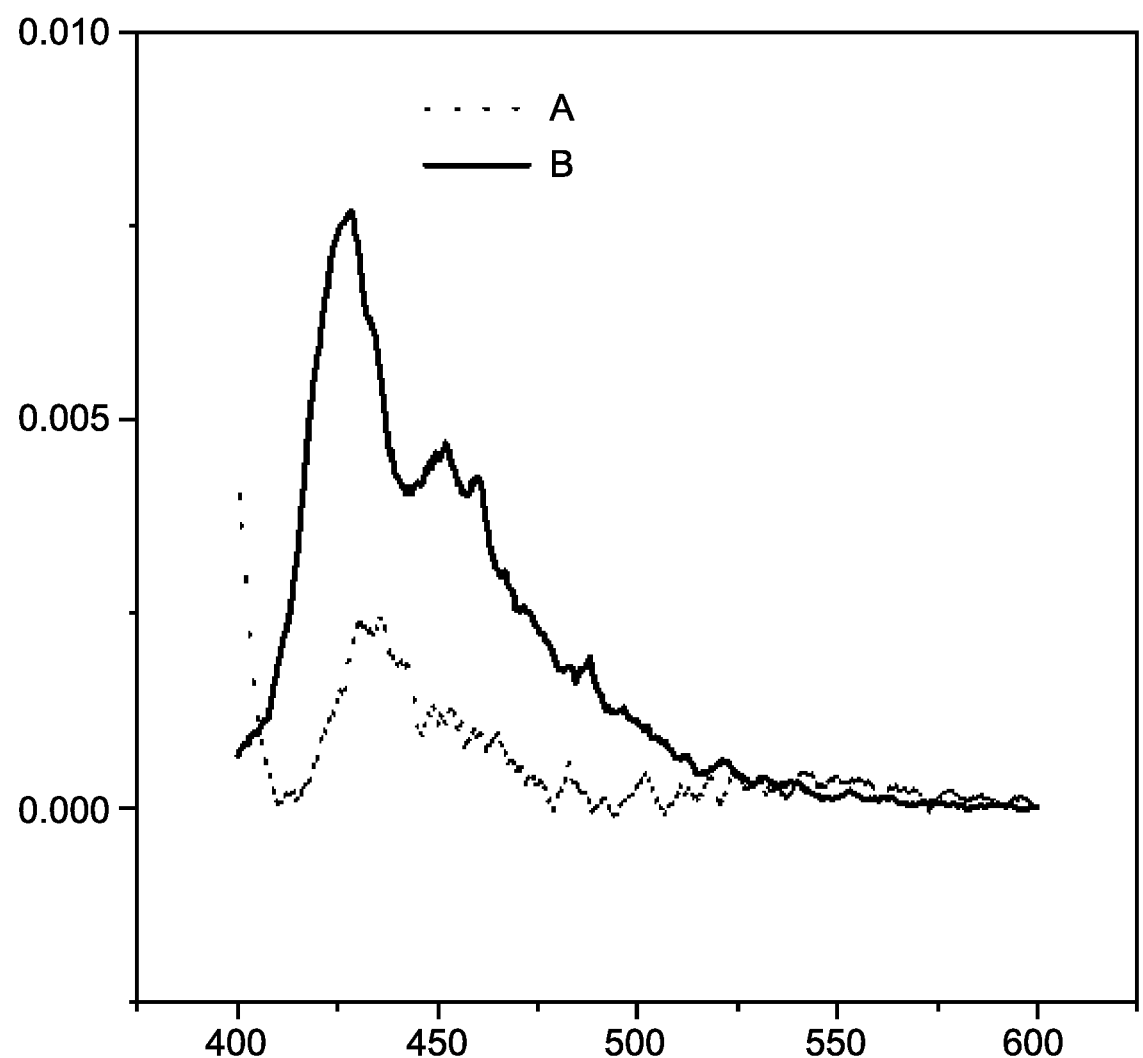
FIG. 7 is a graph the x-axis of which represent wavelength (in nm) and the y-axis of which represents photoluminescence intensity (arbitrary units), for a structured substrate (B) and for a planar substrate (A) exposed to ultraviolet radiation. The structured substrate (B) is a silicon substrate comprising reflective features, of hollow geometric shape, that are made of Ag (V-shaped profile, inclined flanks that make an angle of 45°) and that are filled with a transparent resist. The substrate B is a silicon substrate on which a planar Ag layer is formed. The substrates (A, B) are coated with a helicene organic chiral layer. This graph illustrates the influence of a structured substrate (B) of a device according to the invention—with respect to a planar substrate (A)—on the intensity of the circularly polarized electromagnetic radiation output from the organic chiral layer.

The reflective features 10 advantageously have at least one V-shaped profile. The reflective features 10 advantageously comprise inclined flanks that make an angle θ comprised between 30° and 60°, preferably comprised between 40° and 50°, and more preferably equal to 45°, with respect to the normal to the planar surface of the structured substrate 1. The influence of a substrate structured with V-shaped reflective features (inclined flanks that make an angle of 45°) is shown by FIG. 7. The inventors have observed an increase in the intensity of the polarized electromagnetic radiation of the order of a factor of 3 with respect to a planar substrate.

The reflective features 10 are advantageously periodically distributed in a direction perpendicular to the normal to the planar surface of the structured substrate 1. The reflective features 10 advantageously have a spatial period longer than 5λ, and preferably longer than 10λ. The reflective features 10 advantageously have a depth larger than 5λ, and preferably larger than 10λ. The depth, denoted H, and the spatial period, denoted P, advantageously respect the following relationship: H=P/2.

The reflective features 10 are advantageously made of a metal, which is preferably chosen from Ag and Al. The structured substrate 1 may be made of plastic or of silicon. The features of the structured substrate 1 may be metallized so as to obtain the reflective features 10.

According to one embodiment, the reflective features 10 are of concave shape, and the structured substrate 1 comprises a matrix array of microlenses forming the filler material 11. According to one alternative, the filler material 11 may be a composite (oxide/photo-polymerizable polymer) material formed by a sol-gel process.

The filler material 11 advantageously makes contact (i.e. direct contact) with the first electrode $E_1$ in the sense that there is no element between the filler material 11 and the first electrode $E_1$.

Process for Fabricating the Device for a Top-Emitting Architecture

As illustrated in FIGS. 4a to 4h, a process for fabricating an electroluminescent device according to the invention comprises the following steps:

a) providing a structured substrate 1 comprising features possessing a hollow geometric shape;
b) metallizing the features so as to obtain reflective features 10;
c) forming a filler material 11 that is transparent in a spectral domain inside the reflective features 10 so that the structured substrate 1 has a planar surface;
d) forming a first electrode $E_1$ that is transparent in the spectral domain on the planar surface of the structured substrate 1;
e) forming pixel regions ZP on the first electrode $E_1$ via etching of an electrically insulating resist RI;
f) forming a stack 2 of layers on the pixel regions ZP of the first electrode $E_1$, the stack 2 comprising an electroluminescent layer EL suitable for emitting electromagnetic radiation in the spectral domain, the electromagnetic radiation being circularly polarized in a first polarization direction;
g) forming a second electrode $E_2$ that is semi-transparent in the spectral domain on the stack 2;
h) forming a first encapsulation layer 3 on the second electrode $E_2$;
i) forming first and second contact pads 4a, 4b electrically connected to the first and second electrodes $E_1$, $E_2$, respectively;
j) forming a second encapsulation layer 5 on the first encapsulation layer 3.

Step a) may be executed using a grooved plastic film, for example a BEF II film of the Vikuiti™ trademark. The grooved plastic film may have a thickness of about 150 µm. The hollow geometric shape of the features of the structured substrate 1 provided in step a) is configured so that electromagnetic radiation that passes through the first electrode $E_1$ is reflected from the reflective features 10 while preserving the first polarization direction. Step b) may be executed via wafer-level metallization, so as to form a thin metal layer on the features, for example one made of silver, of a thickness comprised between 50 nm and 100 nm. Step c) may be executed by slot die coating of a composite organic/inorganic resist, followed by cross-linking under the action of UV radiation. Step c) is preferably followed by a step $c_1$) of chemical-mechanical polishing. The first encapsulation layer 3 formed in step h) may be made of SiO. The second encapsulation layer 5 formed in step j) may be deposited by atomic layer deposition (ALD).

Process for Fabricating the Device for a Bottom-Emitting Architecture

Figure 5A:
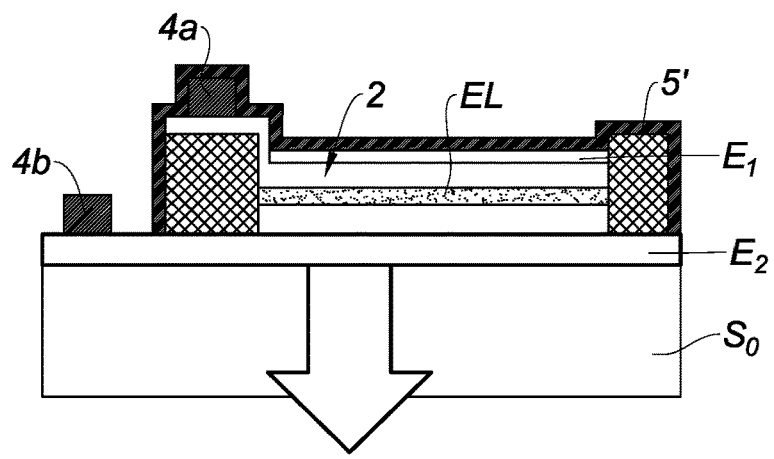
FIGS. 5a to 5c are schematic cross-sectional views illustrating a second process for fabricating an electroluminescent device according to the invention.
Figure 5B:
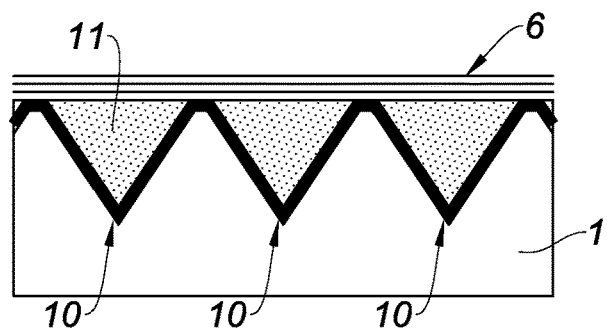
Figure 5C:
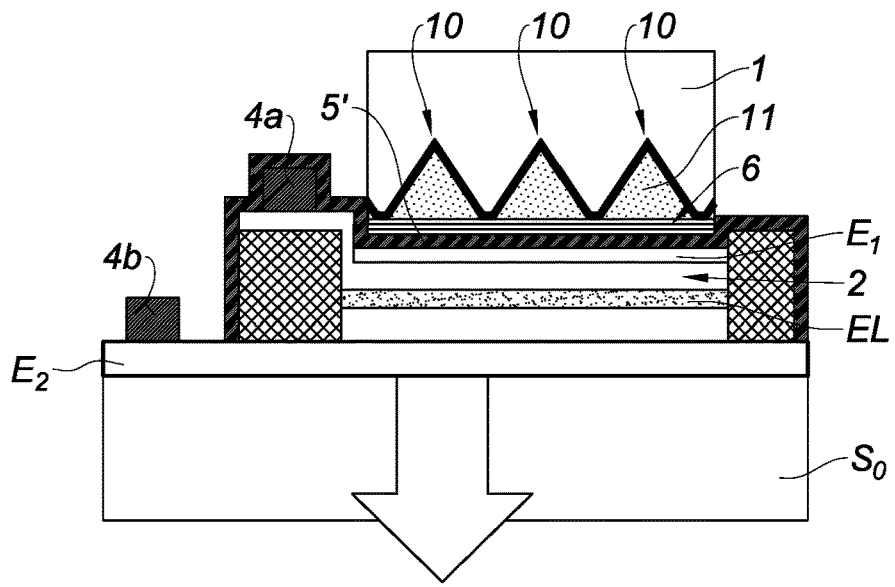

As illustrated in FIGS. 5a to 5c, a process for fabricating an electroluminescent device according to the invention comprises the following steps:

a') providing a light-emitting diode comprising, in succession:
 a glass substrate $S_0$,
 an electrode (second electrode $E_2$) that is transparent in a spectral domain,
 a stack 2 of layers, comprising an electroluminescent layer EL suitable for emitting electromagnetic radiation in the spectral domain, the electromagnetic radiation being circularly polarized in a first polarization direction,
 an electrode (first electrode $E_1$) that is transparent in a spectral domain,
 an encapsulation layer 5';
b') providing a structured substrate 1, formed according to steps a), b) and c) described above;
c') covering the structured substrate 1 with a tri-layer structure 6 so as to encapsulate the structured substrate 1, the tri-layer structure 6 possibly being of the $Al_2O_3$/polymer/$Al_2O_3$ type, the tri-layer structure 6 having a thickness smaller than 1 µm;
d') transferring the structured substrate 1 to the encapsulation layer 5' via the tri-layer structure 6, step d') possibly being executed by adhesive bonding/rolling.

Process for Fabricating the Device for a Display

As illustrated in FIGS. 6a to 6f, a process for fabricating an electroluminescent device according to the invention comprises the following steps:

a") providing a complementary-metal-oxide-semiconductor (CMOS) substrate 1' covered with an electrically insulating resist RI, the substrate 1' comprising a CMOS circuit with a plurality of metallization levels $M_1$, $M_2$, and with pairs of metal-oxide-semiconductor field-effect transistors (MOSFETs), a single transistor being shown in FIGS. 6a to 6f, each thereof comprising a source S, a gate G and a drain D;

b") etching the electrically insulating resist RI so as to form pixel regions; step b") being executed so as to obtain features possessing inclined flanks that make an angle θ comprised between 30° and 60°, and preferably comprised between 40° and 50°, with respect to the normal to the substrate 1'; the CMOS substrate 1' thus being structured at the end of step b");

c") metallizing the features so as to obtain reflective features 10;

d") forming a filler material 11 that is transparent in a spectral domain inside the reflective features 10 so that the structured substrate 1' has a planar surface;

e") forming a first electrode $E_1$ that is transparent in the spectral domain on the planar surface of the structured substrate 1' facing the pixel regions;

f") forming an additional electrically insulating resist RI' on the planar surface of the structured substrate, between the pixel regions, so as to prevent short-circuits between the pixels;

g") forming a stack 2 of layers on the first electrode $E_1$, the stack 2 comprising an electroluminescent layer EL suitable for emitting electromagnetic radiation in the spectral domain, the electromagnetic radiation being circularly polarized in a first polarization direction;

h") forming a second electrode $E_2$ that is semi-transparent in the spectral domain on the stack 2;

i") forming an encapsulation layer (not illustrated) on the second electrode $E_2$.

The electrically insulating resist RI may be a dielectric layer made of SiN or $SiO_2$. The electrically insulating resist RI preferably has a thickness larger than 5 μm. The features obtained in step b") have a hollow geometric shape configured so that the electromagnetic radiation that passes through the first electrode $E_1$ is reflected from the reflective features 10 while preserving the first polarization direction. In step b"), the last metallization level $M_2$ plays the role of etch-stop layer. Step d") may be executed by slot die coating of a composite organic/inorganic resist, followed by cross-linking under the action of UV radiation. Step d") is preferably followed by a step of chemical-mechanical polishing.

The invention is not limited to the described embodiments. Those skilled in the art will be able to consider technically workable combinations thereof, and to substitute equivalents therefor.

The invention claimed is:

1. An electroluminescent device, comprising:
   first and second electrodes that are at least partially transparent in a spectral domain;
   an electroluminescent layer that lies between the first and second electrodes and that is suitable for emitting electromagnetic radiation in the spectral domain, the electromagnetic radiation being circularly polarized in a first polarization direction;
   a structured substrate, the first electrode lying between the structured substrate and the electroluminescent layer, the structured substrate comprising:
      features that are reflective in the spectral domain, and that possess a hollow geometric shape configured so that electromagnetic radiation that passes through the first electrode is reflected from the reflective features while preserving the first polarization direction,
      a filler material that is transparent in the spectral domain and that is arranged to fill the reflective features so that the structured substrate has a planar surface.

2. The device according to claim 1, wherein the hollow geometric shape of the reflective features is configured so that electromagnetic radiation that passes through the first electrode is reflected from the reflective features N times, N being a non-zero even integer number.

3. The device according to claim 1, wherein the reflective features have at least one V-shaped profile.

4. The device according to claim 1, wherein the reflective features comprise inclined flanks that make an angle comprised between 30° and 60° with respect to the normal to the planar surface of the structured substrate.

5. The device according to claim 1, wherein the reflective features are of concave shape, and the structured substrate comprises a matrix array of microlenses forming the filler material.

6. The device according to claim 1, wherein the reflective features are periodically distributed in a direction perpendicular to the normal to the planar surface of the structured substrate.

7. The device according to claim 6, wherein the electromagnetic radiation possesses a dominant wavelength, denoted λ, and the reflective features have a spatial period longer than 5λ, and preferably longer than 10λ.

8. The device according to claim 1, wherein the electromagnetic radiation possesses a dominant wavelength, denoted λ, and the reflective features have a depth larger than 5λ.

9. The device according to claim 8, wherein the depth, denoted H, and the spatial period, denoted P, respect H=P/2.

10. The device according to claim 1, wherein the reflective features are made of a metal chosen from Ag and Al.

11. The device according to claim 1, wherein the electroluminescent layer is made of a chiral organic material.

12. The device according to claim 1, wherein the first and second electrodes are made of a transparent conductive oxide.

13. The device according to claim 1, wherein the spectral domain is chosen from:
   the visible domain with wavelengths comprised between 400 nm and 780 nm,
   the UV-A domain with wavelengths comprised between 315 nm and 400 nm,
   the near-infrared domain with wavelengths comprised between 780 nm and 3 μm.

14. The device according to claim 1, wherein the reflective features comprise inclined flanks that make an angle comprised between 40° and 50° with respect to the normal to the planar surface of the structured substrate.

15. The device according to claim 1, wherein the electromagnetic radiation possesses a dominant wavelength, denoted λ, and the reflective features have a depth larger than 10λ.

* * * * *